United States Patent

[11] 3,577,036

[72] Inventors John J. Curtis
Endwell, N.Y.;
Carl E. Ruoff, Boston, Mass.
[21] Appl. No. 821,592
[22] Filed May 5, 1969
[45] Patented May 4, 1971
[73] Assignee International Business Machines Corporation
Armonk, N.Y.

[54] METHOD AND MEANS FOR INTERCONNECTING CONDUCTORS ON DIFFERENT METALIZATION PATTERN LEVELS ON MONOLITHICALLY FABRICATED INTEGRATED CIRCUIT CHIPS BY ALLOYING AN INTERCONNECTION PORTION OF EACH CONDUCTOR TO CONTIGUOUS PORTIONS OF ONE LOW RESISTIVITY REGION OF THE CHIP
8 Claims, 3 Drawing Figs.

[52] U.S. Cl. .......... 317/101, 317/234, 29/569, 29/576
[51] Int. Cl. .......... H01l 19/00
[50] Field of Search .......... 317/101 (A), 101 (CC), 234/5.3, 234/5.4, 235/44; 29/576—578, 569, 587; 156/17; 148/(Inquired)

[56] References Cited

UNITED STATES PATENTS 3,303,071 2/1967 Kocsis .......... 317/234/5.4(UX)
3,419,765 12/1968 Clark et al. .......... 317/101A(UX)

*Primary Examiner*—David Smith, Jr.
*Attorneys*—Hanifin and Jancin and John C. Black

ABSTRACT: Minimum connection area and maximum reliability over long periods of use are achieved with the improved technique for interconnecting two-level metalization patterns overlying monolithic integrated circuit chips. A pair of metal conductors from each of two levels are joined to each other and are further separately joined to contiguous portions of an isolated low resistivity region in the chip. It has been found that each connection between metalization patterns of two different levels can be effected in an area as small as approximately two-tenths mil by five-tenths mil.

PATENTED MAY 4 1971

3,577,036

INVENTORS
JOHN J. CURTIS
CARL E. RUOFF

BY John C Black
ATTORNEY

METHOD AND MEANS FOR INTERCONNECTING CONDUCTORS ON DIFFERENT METALIZATION PATTERN LEVELS ON MONOLITHICALLY FABRICATED INTEGRATED CIRCUIT CHIPS BY ALLOYING AN INTERCONNECTION PORTION OF EACH CONDUCTOR TO CONTIGUOUS PORTIONS OF ONE LOW RESISTIVITY REGION OF THE CHIP

FIELD OF THE INVENTION

The subject matter of this application is related to an improved method and means for making electrical interconnections between two separate levels of metalization patterns.

One major obstacle to extremely high performance (high speed) logic circuitry on a large scale integrated semiconductor chip (i.e., a substrate of monocrystalline semiconductor material) is the requirement for two levels of metalization patterns (i.e., metal conductor patterns) and, more particularly, to the provision of a reliable means for making each interconnection between the levels in a small area. For low speed logic circuitry, a single level of metalization is satisfactory because orthogonal crossing of signal lines is accomplished through the use of crossunder diffusions below the metal conductors. This technique, however, is not desirable in high performance logic circuitry because signals are unduly delayed due to the phase shift encountered when the signals are passed through a crossunder diffusion. This diffusion is resistive in nature with distributed junction capacitance, thus forming a phase shifting ladder network.

Two levels of interconnected metalization patterns serve as a better solution to this problem because the resistance is reduced by a factor of 200 and the capacitance is decreased by a factor of 10. Another problem arises, however; the problem of securing reliable electrical contact between the two levels of metalization. To achieve this, many have proposed a relatively large connection area in the order of 1 mil by 1 mil to establish a direct connection between the two levels; which proposal, in large scale integration, is unacceptable because of the number and size of such interconnections required. Too much of the chip area is devoted to making the electrical interconnections. In order to make the same number of interconnections between high speed circuits as are typically found in lower performance large scale integrated semiconductor chips, which use the silicon to metal interconnections and crossunder diffusions, the chip area of the high speed circuits would be multiplied by a factor of 5 to 10.

In addition, the reliability of these 1 mil by 1 mil interconnections cannot be assured even with careful control of the process steps. Unsatisfactory interconnections result from the layer of glass between the upper and lower layers being insufficiently removed, from the lower 1 mil by 1 mil portion being substantially etched away during the process step for removing the glass layer between the layers, and/or from corrosive action between the upper and lower layers in the 1 mil by 1 mil area due to incomplete removal of the etching solution.

The known prior method comprises the etching of holes through the glass layer between the upper and lower patterns in the position of each of the interconnection pads. When the etchant etches through the sputtered glass, one of two problems is frequently encountered. Either the etchant etches too far and attacks the aluminum pad causing a chemical reaction between the etchant and the aluminum which frequently leaves the pad defective and causes pin holes; or, on the other hand, it frequently occurs that the etchant is not permitted to etch sufficiently deep to go entirely through the sputtered glass thus causing a small layer of sputtered glass to be left between the aluminum pad and the upper conductive pattern. This glass layer acts as an insulator preventing contact between the desired portions of the upper and lower layers.

It is the primary object of the present invention to provide an improved two-level metalization pattern interconnection method and means.

SUMMARY OF THE INVENTION

Applicants' improved electrical interconnection between the two levels of metalization patterns is based on the fact that a metal to silicon contact is very reliable over long periods of use and can be realized with a very small area, for example, two-tenths mil by three-tenths mil. Where an interconnection is to be made, both layers of metal are separately evaporated on and alloyed to contiguous portions of the same low resistivity diffused region and are, therefore, connected electrically to each other. In addition, the portion of the upper metalization pattern which is to be electrically connected to a corresponding portion of a lower metalization pattern is also evaporated on said corresponding portion of the lower pattern which is connected to the low resistivity diffused region. This technique allows a density of interconnections on a high performance, large scale integrated semiconductor chip which is similar to that achieved on a low performance, large scale integrated semiconductor chip.

BRIEF DESCRIPTION OF THE DRAWINGS

The foregoing and other objects, features and advantages of the invention will be apparent from the following more particular description of a preferred embodiment of the invention, as illustrated in the accompanying drawings.

DESCRIPTION OF THE PREFERRED EMBODIMENT

Figure 3:
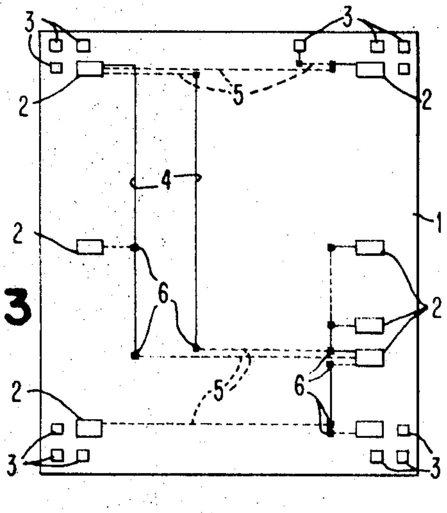
FIG. 3 diagrammatically illustrates a semiconductor chip having a plurality of transistor circuits formed thereon and interconnected by the improved interconnection method and means of the present invention.

In FIG. 3 there are shown, by way of example, bipolar transistor switching circuits 2 on a semiconductor chip 1. Terminals 3 around the periphery of the chip couple operating potentials to the circuits 2 and also couple data signals into and out of the circuits on the chip.

Signal path interconnections between circuits 2 on the same chip and between circuits 2 and signal terminals 3 are made by way of an upper layer of metalization patterns 4, a lower pattern layer 5, and interconnection structures 6.

Figure 2:
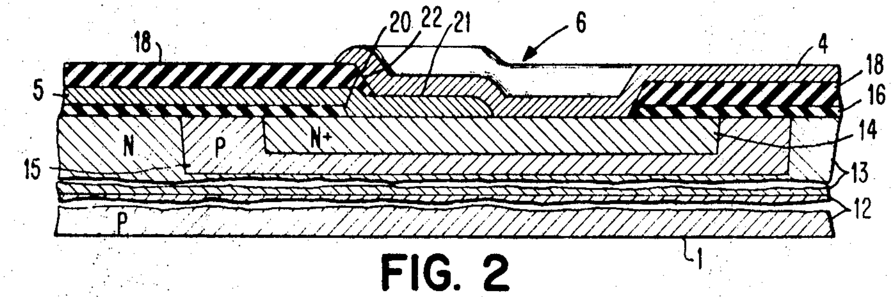
FIG. 2 is a fragmentary elevation sectional view along lines 2–2 of FIG. 1 illustrating one preferred form of the improved interconnection.
Figure 1:
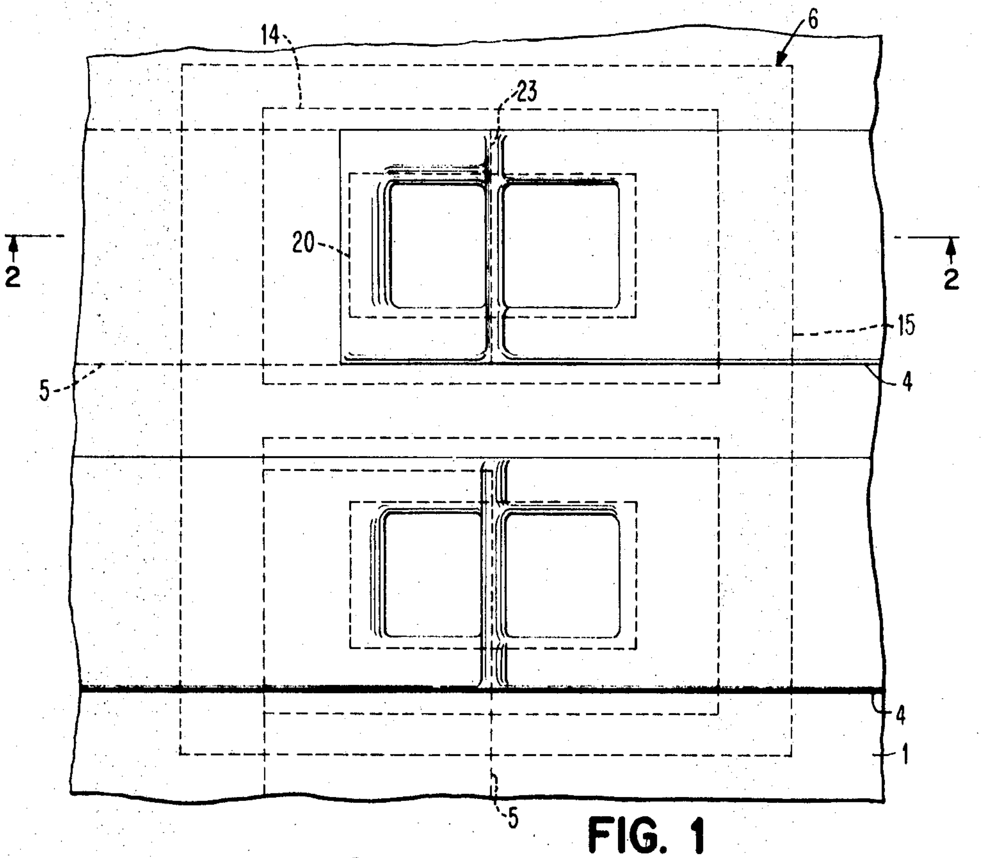
FIG. 1 is a fragmentary plan view of a semiconductor chip illustrating two electrical interconnections embodying the improvements of the present application.

FIGS. 1 and 2 illustrate in detail one preferred form of the improved interconnection structures 6 for two-level metalization patterns. The semiconductor chip 1 includes a substrate 12 (FIG. 2) of P conductivity type and an epitaxial layer 13 of N conductivity type. As is well known in the art, NPN bipolar transistor circuits 2 are formed in a conventional manner within the epitaxial layer; and, in many instances, the collector regions (not shown) are bounded on the underside thereof by buried subcollector regions (not shown) within the substrate layer 12.

In the preferred embodiment, the improved interconnection structure 6 includes a low resistivity N+ diffusion region 14 (less than 50 ohms per square, preferably in the order of 5 ohms per square or less) which is isolated from the epitaxial layer 13 by means of a P type diffusion region 15. In one preferred form of the invention, the P type diffusion region 15 is formed simultaneously with the base diffusion regions (not shown) of the various NPN transistors formed on the chip and the N+ diffusion region 14 is formed simultaneously with the transistor emitter diffusions. A conventional silicon dioxide layer 16, which may be in the order of 3,000 angstroms thick, is deposited on the upper surface of the epitaxial layer 13. The lower metalization pattern 5 is formed on the top of the silicon dioxide film 16. A layer of sputtered glass 18, which may have a thickness in the order of 15,000 angstroms, is formed above the lower metalization pattern 15. Finally, the upper or second metalization pattern 4 is formed on the upper surface of the sputtered glass film 18.

In the preferred embodiment, a rectangular opening 20 in the silicon dioxide film 16 is positioned immediately above and centered with respect to the rectangular N+ diffusion region 14. A portion of the lower metalization pattern 5 extends into one portion of the opening 20 and makes direct electrical and mechanical contact with the upper surface of the diffusion region 14. A portion of the upper metalization pattern 4 extends through the opening 20 and makes direct electrical and mechanical contact with the remaining exposed portion of the upper surface of the diffusion region 14 and further makes direct mechanical and electrical contact with the lower metalization pattern at 21.

Pertinent steps of one suitable method of fabricating a semiconductor chip such as that shown in FIGS. 1—3 will be described briefly by way of example only. It will be appreciated that other known methods may be utilized.

It will be assumed that the fabrication process is initiated with the P-type substrate 12. A layer of silicon dioxide is grown on the upper surface of the substrate. The silicon dioxide layer is then patterned (masked) for the diffusion of buried subcollector regions (not shown) in the upper surface of the substrate as required for the various transistor circuits 2. The buried subcollector diffusions are formed. The silicon dioxide layer is then removed and the N-type epitaxial layer 13 is thermally grown on the upper surface of the substrate.

A layer of silicon dioxide is then grown over the upper surface of the epitaxial layer. The oxide layer is then patterned for the diffusion of P+ isolation regions around the transistors. The isolation diffusions are formed. A silicon dioxide layer is again grown over the upper surface and is then patterned for diffusing the base regions of the transistors and the isolation region, such as 15 of FIGS. 1 and 2, for each of the interconnection structures 6. The base diffusions are formed.

A silicon dioxide layer is again grown over the upper surface of the chip and is patterned for the transistor-emitter diffusions and the low resistivity N+ region 14 of FIGS. 1 and 2 and similar regions for all other interconnection structures 6 on the chip 1. The emitter diffusions are formed.

The layer of silicon dioxide 16 is grown on the upper surface of the chip and is subsequently patterned for openings such as 20. All of the other required holes (not shown) for connecting the lower metalization pattern to the transistor diffusions and the like are formed simultaneously.

The first layer of aluminum is then evaporated over the entire surface of the chip 1. By suitable masking and photoresist techniques, the undesired portions of the aluminum surface are etched away, leaving only the conductive pattern 5. In the preferred embodiment, the aluminum layer will fill the entire opening 20, initially. However, the rightmost half of the aluminum within the opening 20 is removed when the undesired portions of the aluminum surface are removed.

The aluminum in the openings such as 20 and the contact holes is then alloyed to the semiconductor material.

The layer of sputtered glass 18 is thermally grown over the upper surface of the chip 1 and is then patterned for etching portions of openings such as 22 of FIG. 2 and for etching the contact holes (not shown) through which transistor diffusions and the like will be connected to the upper conductive pattern 4. The contact holes are etched through this layer of sputtered glass such that the rightmost portion of the opening 20 is opened again to expose the N+ diffusion 14 and the upper surface of the pattern 5 is exposed at 21. The upper layer of aluminum is evaporated over the entire surface of the chip 1, and, by means of suitable masking and photoresist techniques, the undesired aluminum is etched away, leaving the upper conductive pattern 4.

The portions of the pattern 4 within the openings such as 20 and within the other contact holes are than alloyed to the diffusion regions upon which they have been evaporated.

While the invention has been particularly shown and described with reference to a preferred embodiment thereof, it will be understood by those skilled in the art that various changes in form and details may be made therein without departing from the spirit and scope of the invention.

We claim:

1. In a structure of the type in which a plurality of bipolar transistor circuits are formed in the epitaxial layer on one face of the substrate of a single semiconductor chip by a monolithic fabrication technique,
   in which first and second metalization patterns are formed in two electrically isolated layers, one above the other, on said face of the chip, and,
   in which the circuits are electrically interconnected by means including the metalization patterns,
   wherein at least certain of the interconnection means are each characterized by
   a first diffused low resistivity region formed in said epitaxial layer,
   a second diffused region formed in said epitaxial layer electrically isolating the first diffused region from the remainder of the epitaxial layer,
   an interconnection portion of the first metalization pattern of one layer and an interconnection portion of the second metalization pattern of the other layer alloyed together with respective contiguous parts of said first diffused region to form an ohmic electrical connection between said pattern portions by way of the contiguous parts of said first diffused region.

2. The structure of claim 1 wherein said first diffused region has a maximum resistivity in the order of 50 ohms per square.

3. The structure of claim 1 wherein said first diffused region has a resistivity in the order of 4 to 20 ohms per square.

4. In a structure of the type
   in which a plurality of bipolar transistor circuits are formed in the epitaxial layer on one face of the substrate of a single semiconductor chip by a monolithic fabrication technique,
   in which first and second metalization patterns are formed in two electrically isolated layers, one above the other, on said face of the chip, and,
   in which the circuits are electrically interconnected by means including the metalization patterns,
   wherein at least certain of the interconnection means are each characterized by
   a first diffused low resistivity region formed in said epitaxial layer,
   a second diffused region formed in said epitaxial layer electrically isolating the first diffused region from the remainder of the epitaxial layer,
   an interconnection portion of the first metalization pattern of one layer and an interconnection portion of the second metalization pattern of the other layer alloyed together with respective contiguous parts of said first diffused region to form an electrical connection between said pattern portions,
   said interconnection portion of the second metalization pattern overlying and engaging said interconnection portion of the first metalization pattern.

5. The structure as defined in claim 4
   wherein each of said first diffused regions is formed simultaneously with transistor emitter regions, and
   wherein each of said second diffused regions is formed simultaneously with transistor base regions.

6. In a structure of the type
   in which transistor circuits are formed in one face of the substrate of a single semiconductor chip by a monolithic fabrication technique,
   in which metalization patterns are formed in two electrically isolated layers, one above the other on said face of the chip, and
   in which the circuits are electrically interconnected by means including the metalization patterns,
   wherein at least certain of the interconnection means are each characterized by a low resistivity diffusion region formed in said face and electrically isolated from the remainder of the substrate, and a portion of the pattern of one layer and a portion of the pattern of the other layer engaging each other and alloyed together with contiguous parts of said low resistivity region to form a low impedance electrical connection between said pattern portions.

7. In a method of the type including the steps of growing an epitaxial layer on one face of the substrate of a single semiconductor chip, forming a plurality of bipolar transistor circuits in the epitaxial layer, forming first and second metalization patterns in two electrically isolated layers, one above the other, on the epitaxial layer, and electrically interconnecting the circuits by way of the metalization patterns, the improvement being a method of reliably interconnecting adjacent portions of the upper and lower metalization patterns comprising the steps of forming an isolated low resistivity region in the epitaxial layer in each position where an interconnection is to be made between metalization patterns, alloying selected portions of the lower metalization pattern to parts of respective ones of said low resistivity regions, and alloying selected portions of the upper metalization pattern to the remaining parts of respective ones of said low resistivity regions to make a reliable contact between the patterns by way of each low resistivity region.

8. The method of claim 7 further characterized by the steps of forming the low resistivity regions simultaneously with the formation of the transistor emitter regions, forming an isolation region of opposite conductivity type around each low resistivity region simultaneously with the formation of the transistor base regions.